US012545989B2

(12) United States Patent
Kim

(10) Patent No.: US 12,545,989 B2
(45) Date of Patent: Feb. 10, 2026

(54) DEPOSITION MASK MADE OF METAL FOR OLED PIXEL DEPOSITION AND METHOD FOR MANUFACTURING DEPOSITION MASK

(71) Applicant: LG INNOTEK CO., LTD., Seoul (KR)

(72) Inventor: Nam Ho Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 707 days.

(21) Appl. No.: 17/912,598

(22) PCT Filed: Feb. 24, 2021

(86) PCT No.: PCT/KR2021/002322
§ 371 (c)(1),
(2) Date: Sep. 19, 2022

(87) PCT Pub. No.: WO2021/215642
PCT Pub. Date: Oct. 28, 2021

(65) Prior Publication Data

US 2023/0142411 A1 May 11, 2023

(30) Foreign Application Priority Data

Apr. 23, 2020 (KR) ........................ 10-2020-0049361

(51) Int. Cl.
*C23C 14/04* (2006.01)
*H10K 71/16* (2023.01)

(52) U.S. Cl.
CPC ......... *C23C 14/042* (2013.01); *H10K 71/166* (2023.02)

(58) Field of Classification Search
CPC ........ H10K 71/166; C30B 25/04; C23C 8/04; C23C 10/04; C23C 14/04; C23C 14/042;
(Continued)

(56) References Cited

U.S. PATENT DOCUMENTS 8,115,216 B2 * 2/2012 Smith .................. G09G 3/3208 257/89
8,211,494 B2 7/2012 Takenaka et al.
(Continued)

FOREIGN PATENT DOCUMENTS

EP 3168891 5/2017
EP 3439066 2/2019
(Continued)

OTHER PUBLICATIONS

European Search Report dated Sep. 13, 2023 issued in Application No. 21791628.7.
(Continued)

*Primary Examiner* — Aiden Lee
(74) *Attorney, Agent, or Firm* — KED & ASSOCIATES, LLP

(57) ABSTRACT

A deposition mask according to an embodiment comprises a metal plate comprising a deposition area and a non-deposition area. The through-hole comprises a communicating portion connected to a first facing hole configured such that the first diameter slopes at an acute angle with regard to one surface in the transverse-axis direction of the metal plate, and a communicating portion connected to a second facing hole configured such that the first diameter slopes at an obtuse angle with regard to one surface in the transverse-axis direction of the deposition mask. In the longitudinal-axis direction of the metal plate, the first facing hole and the second facing hole are arranged alternately in a row. In the transverse-axis direction of the metal plate, the first facing hole and the second facing hole are arranged alternately in a row. A first island portion is arranged between two adjacent first facing holes in a first diagonal direction joining the first diameters of the communicating portions connected to the first facing holes. A second island portion is arranged between two adjacent second facing holes in a second
(Continued)

diagonal direction joining the first diameters of the communicating portions connected to the second facing holes. A rib is arranged between the first island portion and the second island portion. The deviation in size between the first island portion and the second island portion, which are adjacent to each other, is 30% or less.

18 Claims, 11 Drawing Sheets

(58) Field of Classification Search
CPC ..... C23C 14/044; C23C 16/04; C23C 16/042; C23C 18/06
See application file for complete search history.

(56) References Cited

U.S. PATENT DOCUMENTS

| | | | | |
|---|---|---|---|---|
| 9,601,343 | B2 | 3/2017 | Watanabe | |
| 10,186,557 | B2 | 1/2019 | Ma | |
| 11,066,738 | B2 | 7/2021 | Liu et al. | |
| 11,367,752 | B2 * | 6/2022 | Du | H10K 59/352 |
| 2013/0002118 | A1 * | 1/2013 | Ko | H05B 33/02 313/1 |
| 2013/0040463 | A1 | 2/2013 | Oyama | |
| 2016/0276416 | A1 | 9/2016 | Ma | |
| 2019/0203338 | A1 | 7/2019 | Kawasaki et al. | |
| 2019/0237490 | A1 | 8/2019 | Hu et al. | |
| 2019/0251895 | A1 * | 8/2019 | Zhang | G09G 3/32 |
| 2020/0080186 | A1 | 3/2020 | Liu et al. | |
| 2020/0235298 | A1 * | 7/2020 | Nishi | C23C 14/042 |

FOREIGN PATENT DOCUMENTS

| | | |
|---|---|---|
| KR | 10-2006-0006998 | 1/2006 |
| KR | 10-2012-0099529 | 9/2012 |
| KR | 10-2018-0046970 | 5/2018 |
| KR | 10-2019-0013852 | 2/2019 |
| KR | 10-2019-0045353 | 5/2019 |
| KR | 10-2020-0027253 | 3/2020 |
| KR | 10-2020-0028018 | 3/2020 |
| WO | WO 2019/050198 | 3/2019 |

OTHER PUBLICATIONS

Korean Office Action dated Nov. 7, 2024 issued in Application No. 10-2022-7028459.
International Search Report dated Jun. 10, 2021 issued in Application No. PCT/KR2021/002322.

* cited by examiner

【FIG. 1】
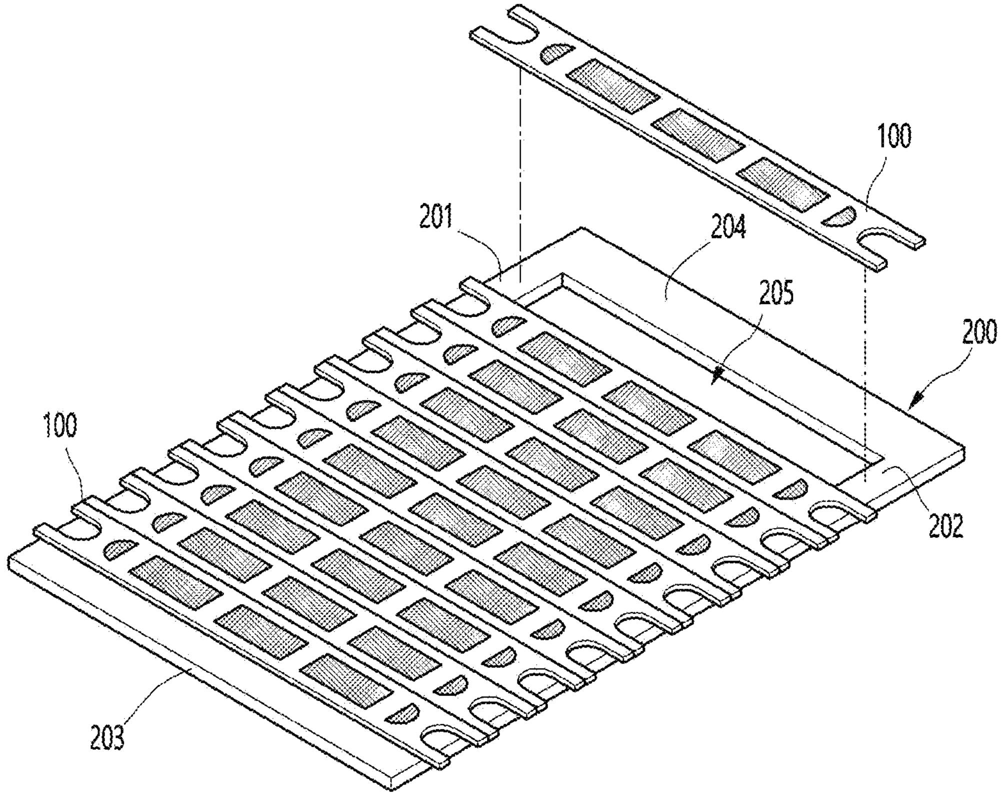

【FIG. 2】
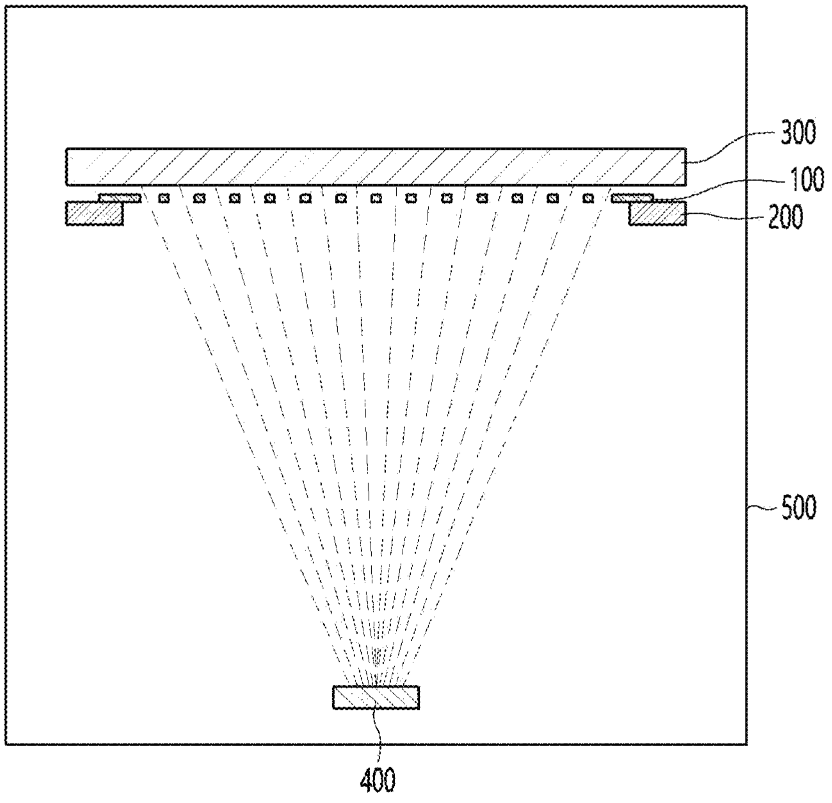
【FIG. 3】
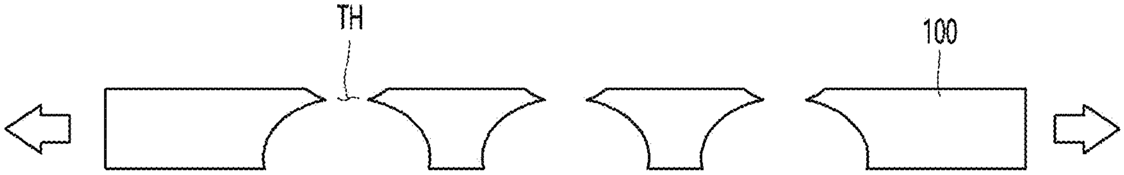

【FIG. 4】
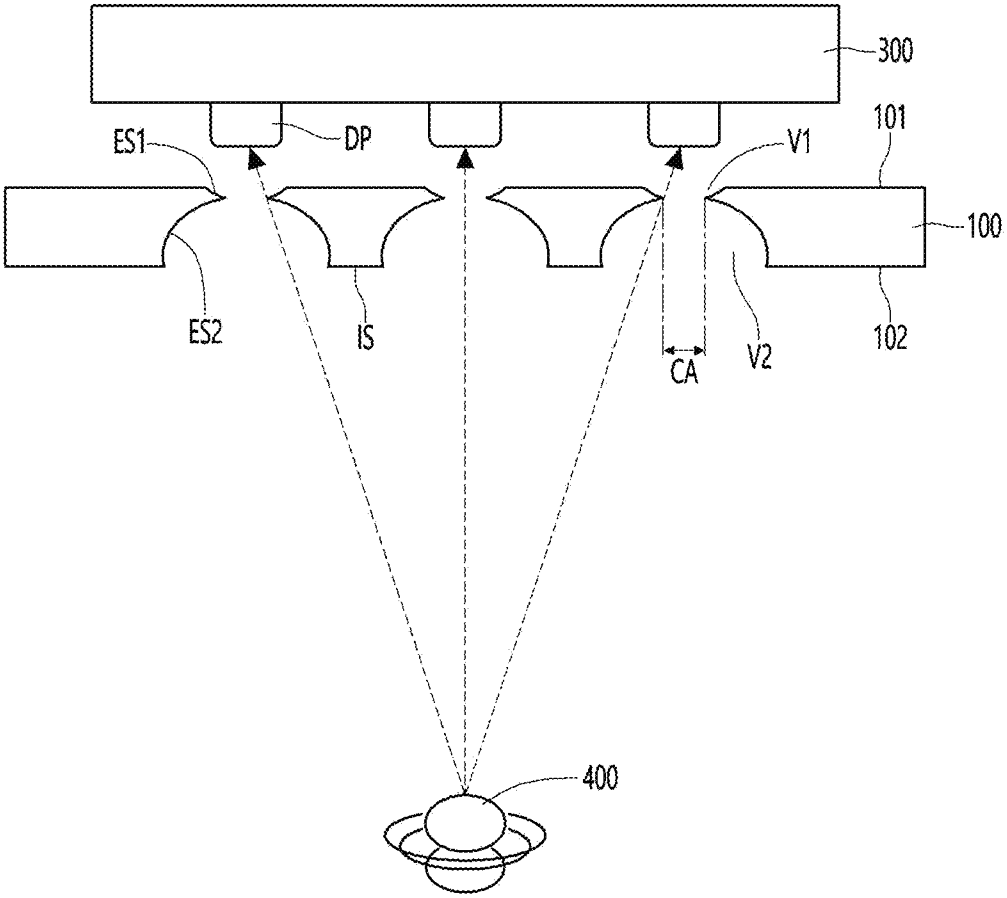

【FIG. 5】
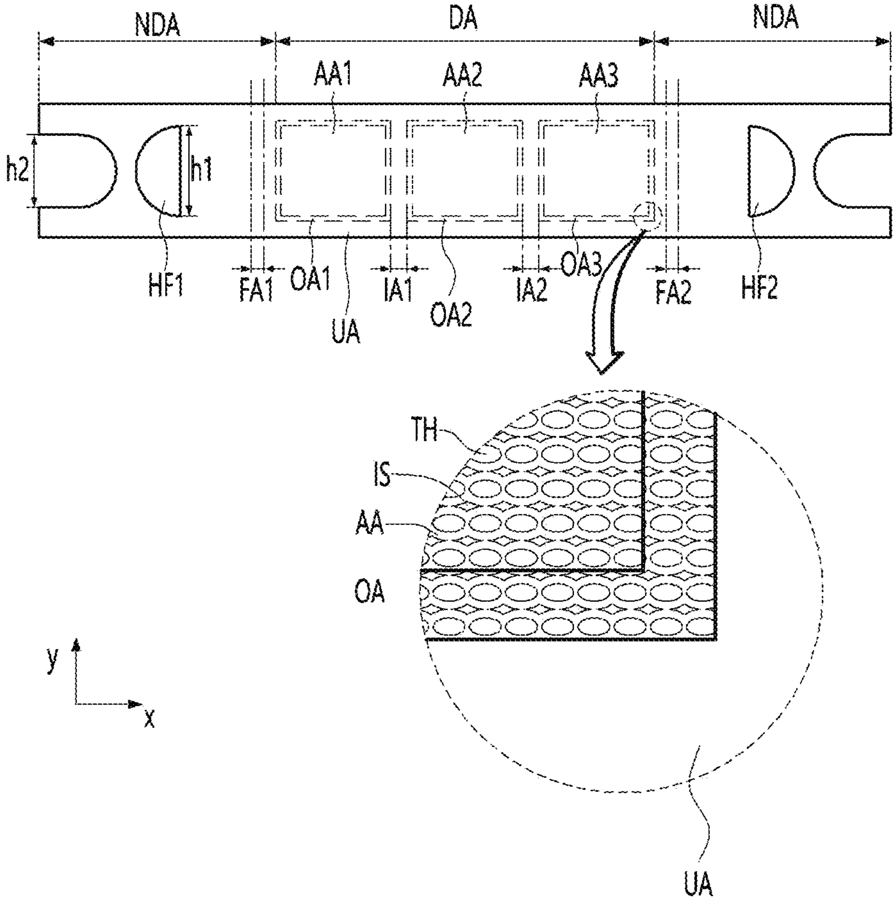

【FIG. 6】
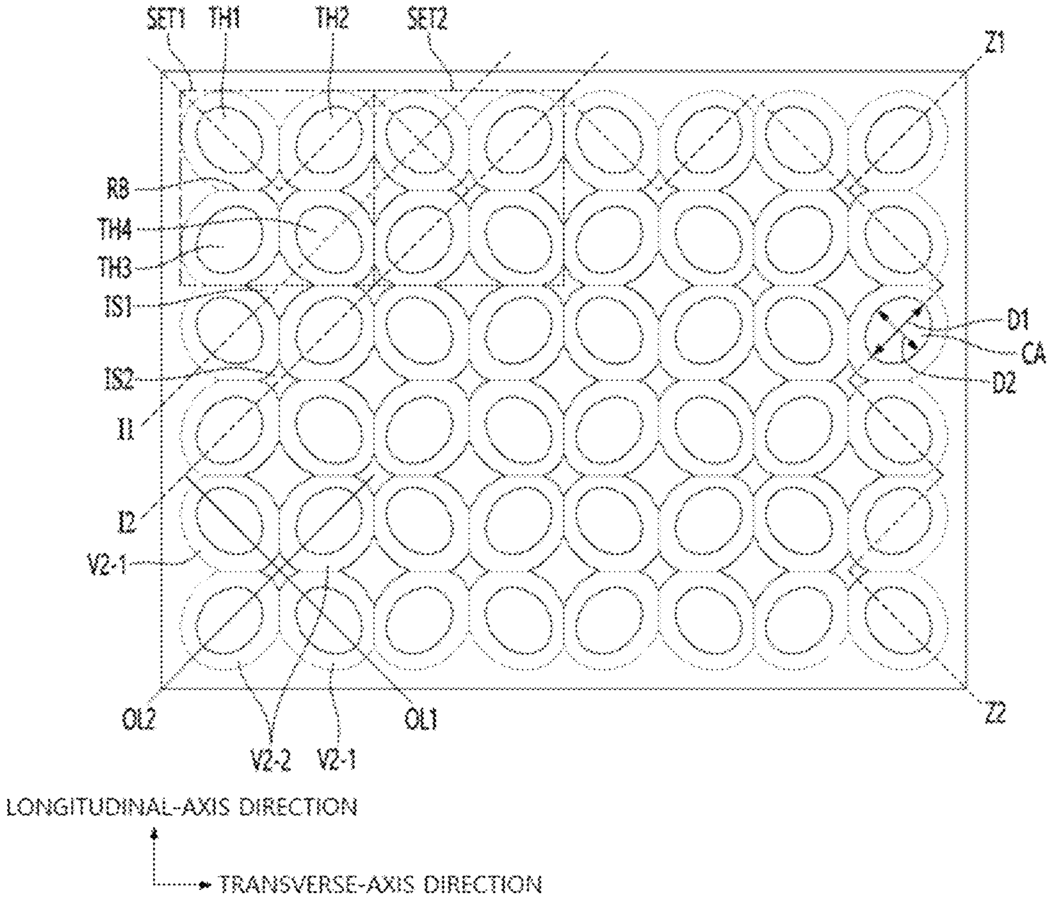

【FIG. 7】
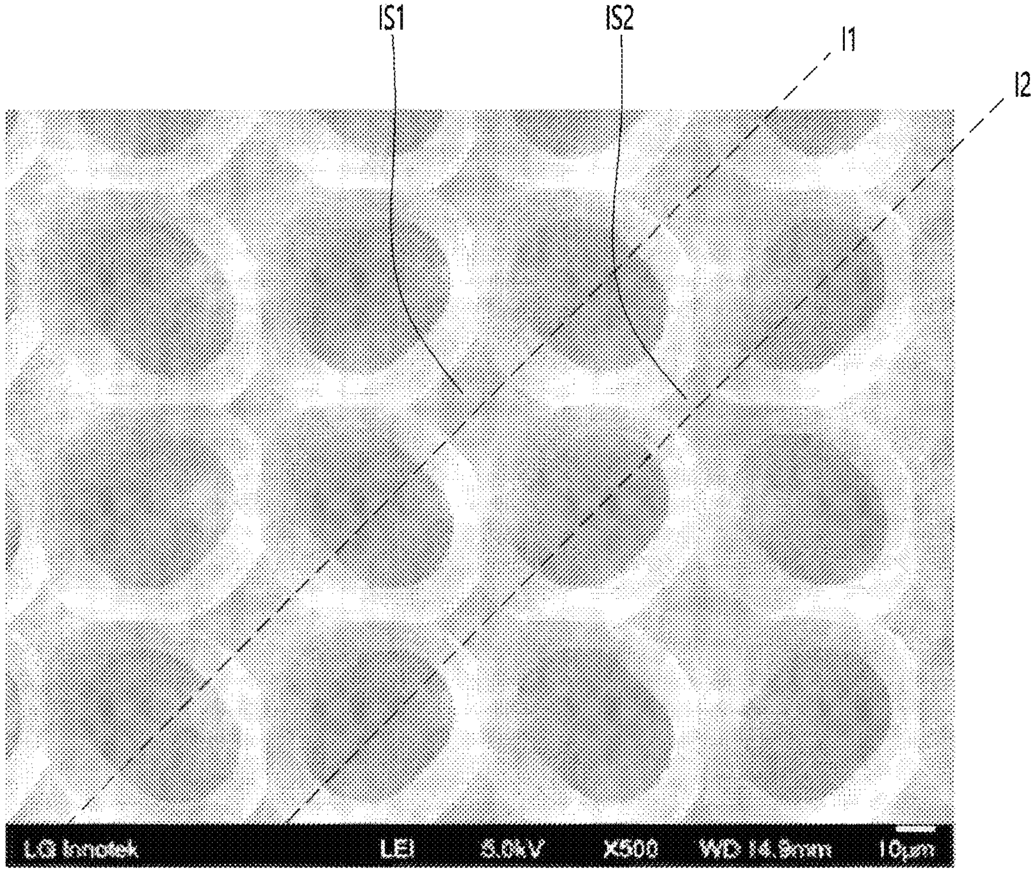

【FIG. 8】
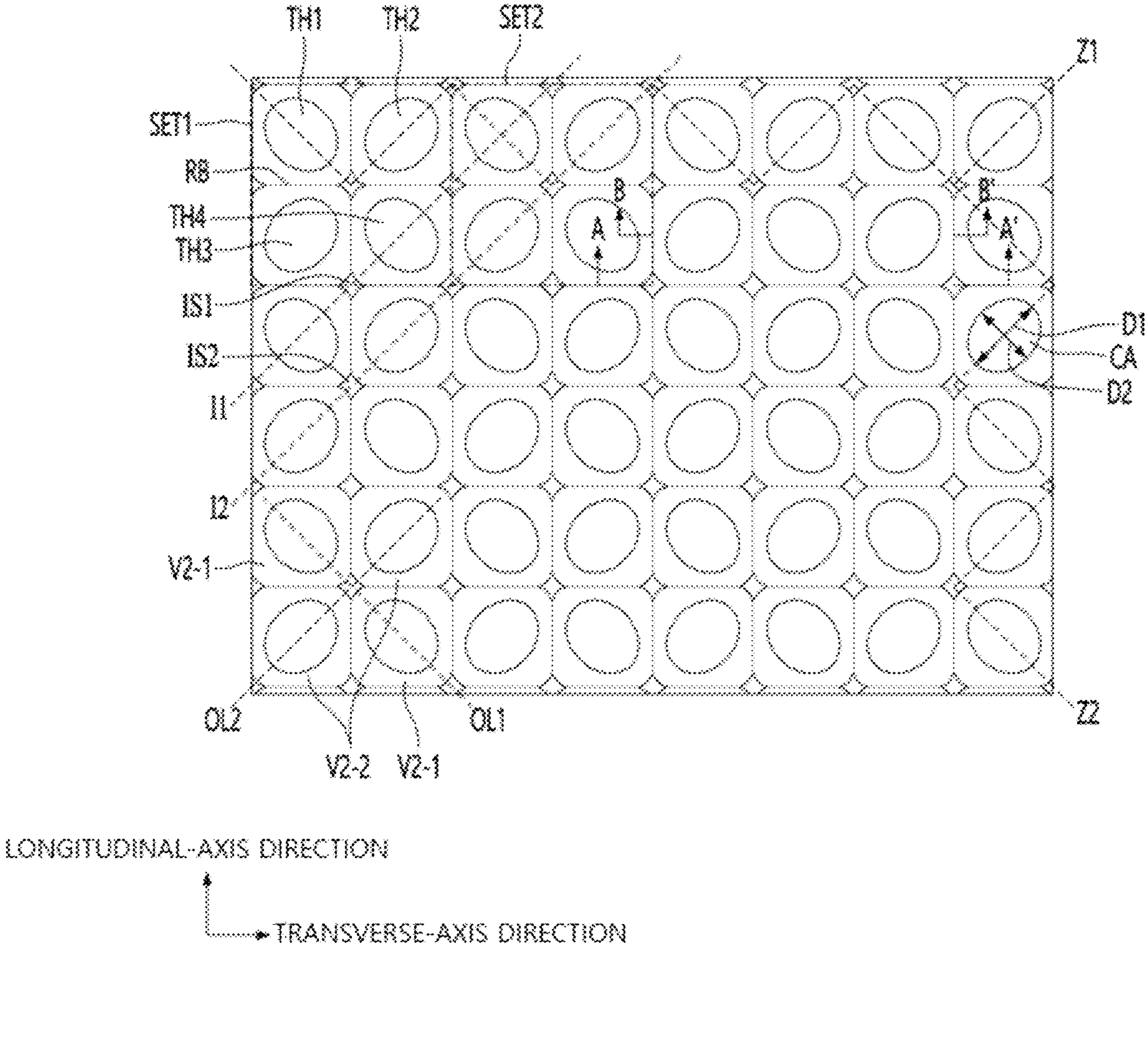

【FIG. 9】
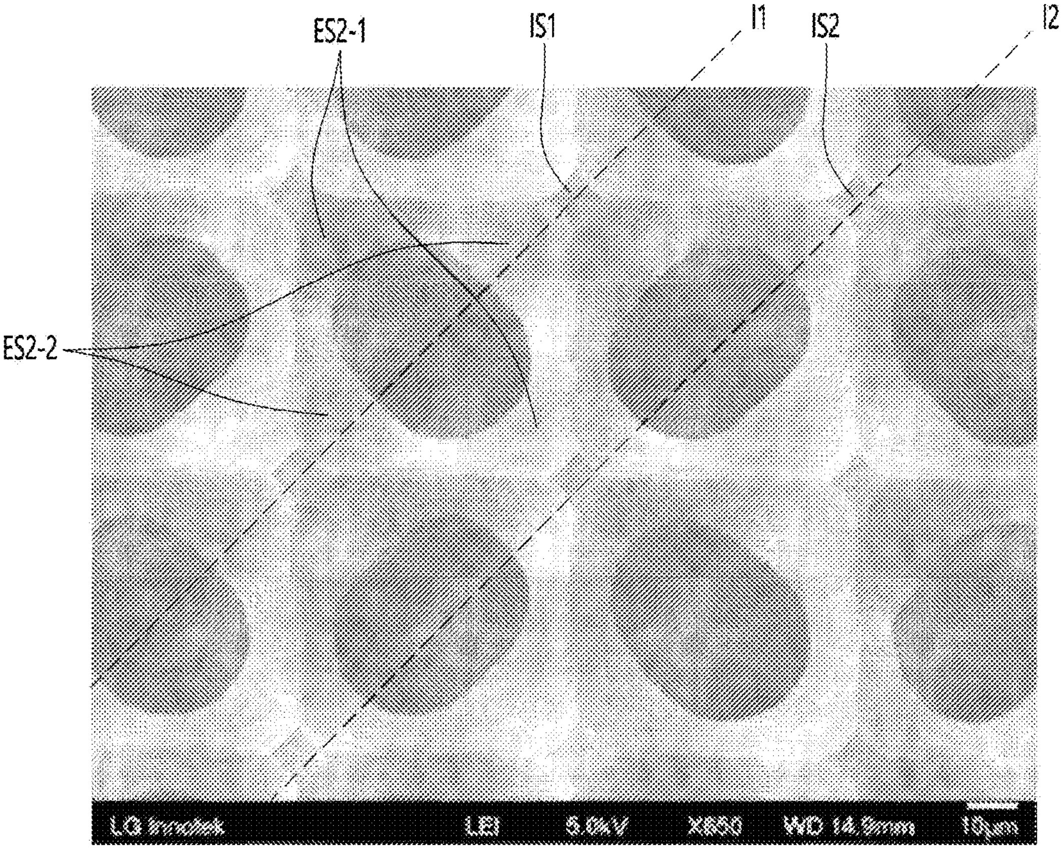
【FIG. 10】
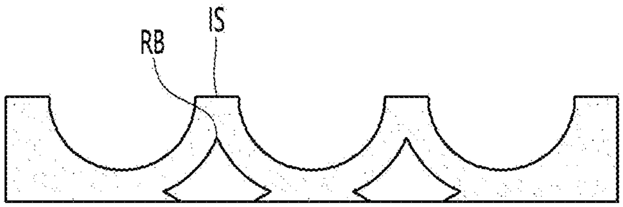

【FIG. 11】
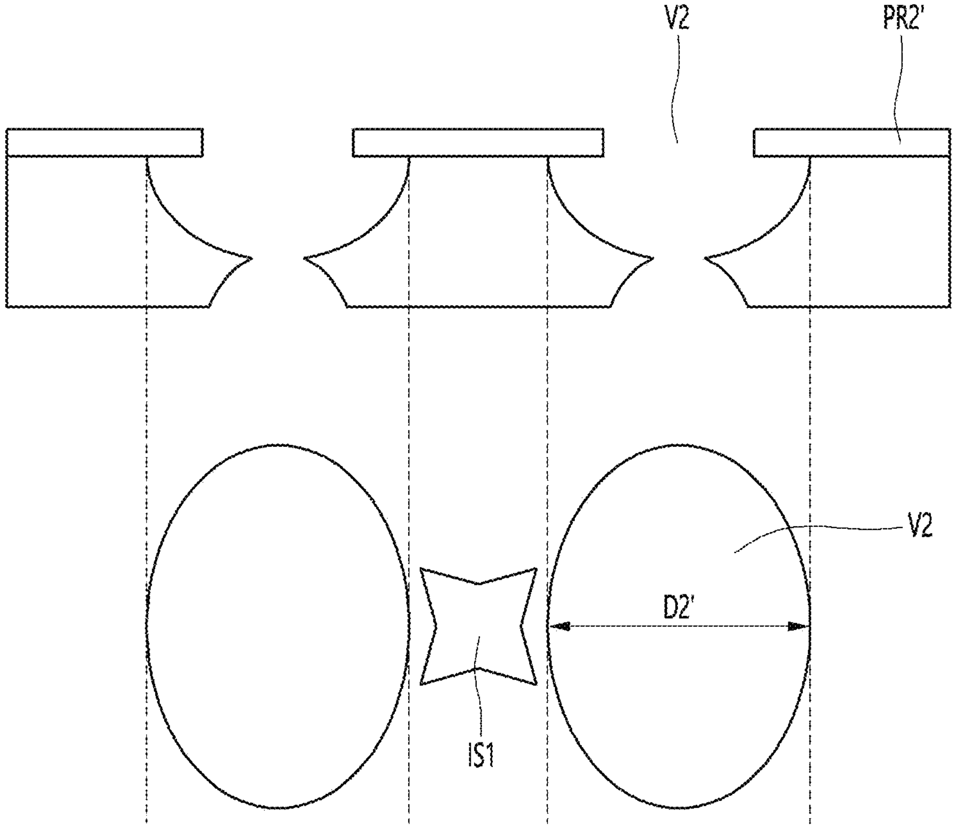

【FIG. 12】
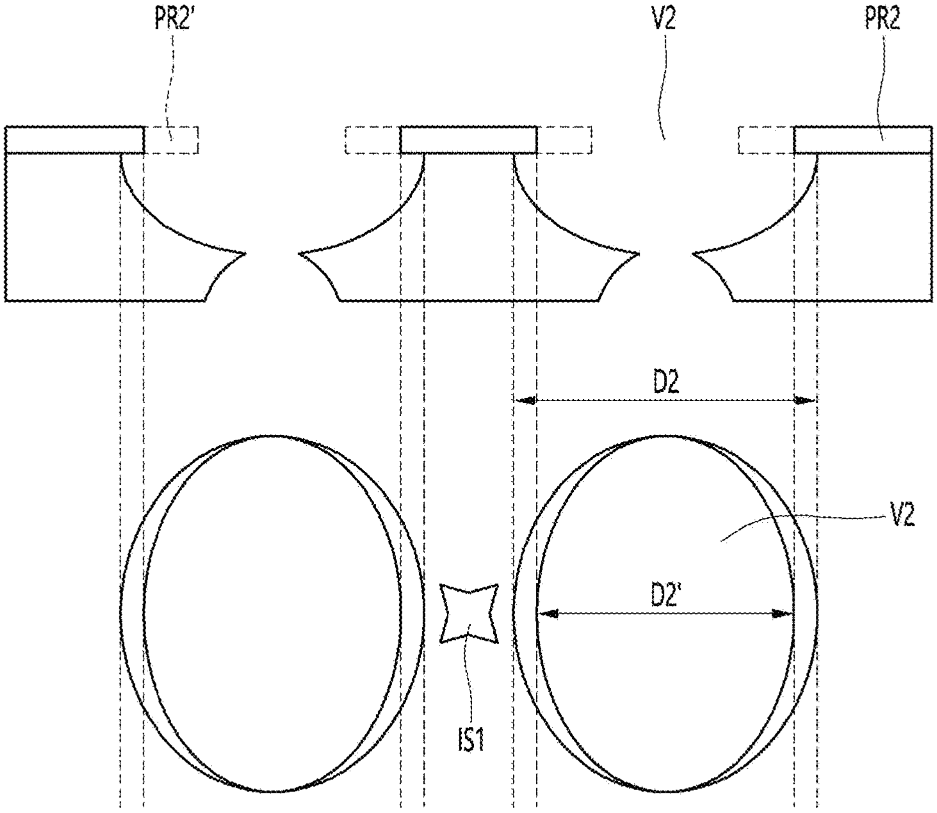
【FIG. 13】
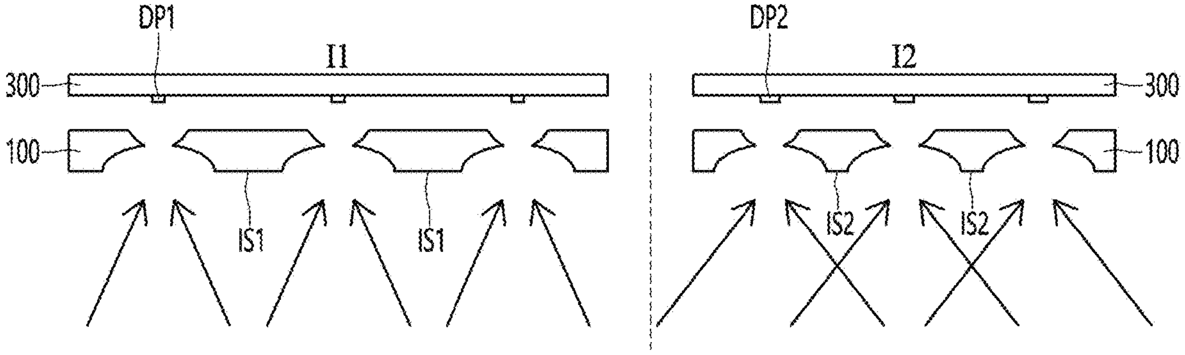

【FIG. 14】
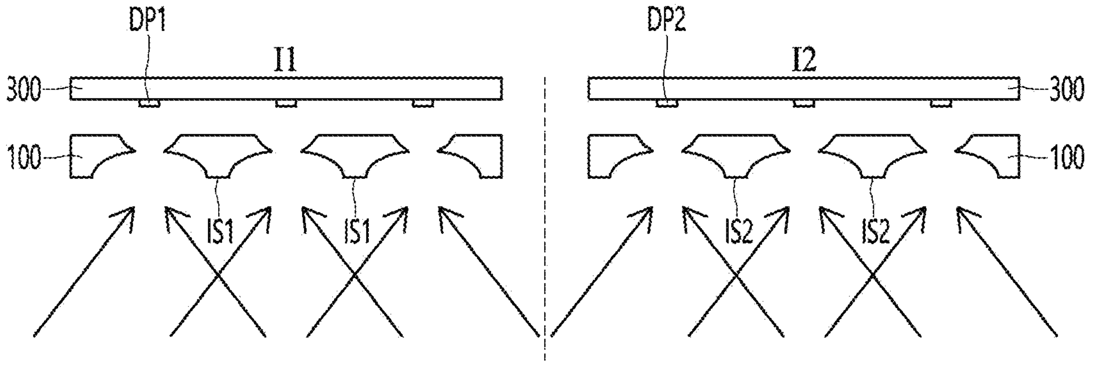
【FIG. 15】
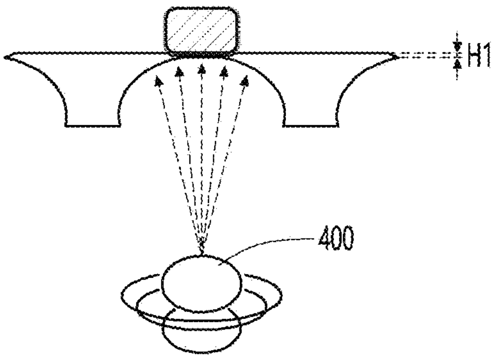
【FIG. 16】
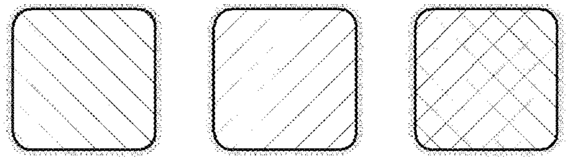

DEPOSITION MASK MADE OF METAL FOR OLED PIXEL DEPOSITION AND METHOD FOR MANUFACTURING DEPOSITION MASK

CROSS-REFERENCE TO RELATED PATENT APPLICATIONS

This application is a U.S. National Stage Application under 35 U.S.C. § 371 of PCT Application No. PCT/KR2021/002322, filed Feb. 24, 2021, which claims priority to Korean Patent Application No. 10-2020-0049361, filed Apr. 23, 2020, whose entire disclosures are hereby incorporated by reference.

TECHNICAL FIELD

An embodiment is for improving deposition performance in a deposition mask in which elliptical-shaped through-holes are disposed in a zigzag form.

BACKGROUND ART

A display device is used by being applied to various devices. For example, the display device is used by being applied to not only small devices such as smart phones and tablet PCs but also large devices such as TVs, monitors, and public displays (PDs). In particular, recently, the demand for ultra-high definition (UHD) of 500 pixels per inch (PPI) or more has increased, and high-resolution display devices have been applied to small devices and large devices. Accordingly, interest in technologies for realizing low power and high resolution is increasing.

Generally used display devices may be largely classified into a liquid crystal display (LCD), an organic light emitting diode (OLED), and the like according to a driving method.

The LCD is a display device driven by using a liquid crystal, and has a structure in which a light source including a cold cathode fluorescent lamp (CCFL), a light emitting diode (LED), or the like is disposed at lower portion of the liquid crystal. The LCD is a display device driven by controlling an amount of light emitted from the light source using the liquid crystal disposed on the light source.

In addition, the OLED is a display device that is driven by using an organic material, and does not require a separate light source, and the organic material itself may function as a light source and may be driven with low power consumption. In addition, OLED has attracted attention as a display device that may express an infinite contrast ratio, has a response speed of about 1000 times faster than the LCD, and may replace the LCD with an excellent viewing angle.

In particular, the organic material included in an emission layer of the OLED may be deposited on a substrate by a deposition mask called a fine metal mask (FMM), and the deposited organic material may be formed in a pattern corresponding to the pattern formed on the deposition mask to serve as a pixel. The deposition mask is generally manufactured by an invar alloy metal plate containing iron (Fe) and nickel (Ni). In this case, through-holes passing through the one surface and the other surface may be formed on one surface and the other surface of the metal plate, and the through-holes may be formed at positions corresponding to a pixel pattern. Accordingly, organic materials such as red, green, blue, and the like may be deposited on the substrate through the through-holes of the metal plate, and the pixel pattern may be formed on the substrate.

When the deposition mask has a circular through-hole, a uniform through-hole may be formed. Accordingly, a uniform deposition pattern may be formed.

Meanwhile, when elliptical-shaped through-holes are disposed in a zigzag form, there is a problem that a size of a deposition pattern differs according to a direction.

Therefore, there is a need for a deposition mask having a new structure in which the uniformity of the through-holes may be improved regardless of a direction while the elliptical-shaped through-holes are disposed in the zigzag form and a method of manufacturing the same.

DISCLOSURE

Technical Problem

An embodiment is directed to providing a deposition mask having a uniform pore diameter by controlling a size deviation of a large pore diameter and a size deviation of an island of the deposition mask.

Technical Solution

A deposition mask according to an embodiment includes a metal plate including a deposition region and a non-deposition region, wherein the deposition region includes a plurality of effective regions forming a deposition pattern and a separation region between a plurality of effective portions, the plurality of effective regions include a plurality of through-holes, and the plurality of through-holes include: a plurality of small surface holes formed on one surface; a plurality of large surface holes formed on the other surface opposite to the one surface; and a communication portion for communicating the small surface hole and the large surface hole, wherein the communication portion has an elliptical shape having a first diameter and a second diameter different from the first diameter, the through-hole includes a communication portion connected to a first large surface hole in which one surface of the metal plate in a transverse-axis direction and the first diameter are inclined at an acute angle and a communication portion connected to a second large surface hole in which one surface of the deposition mask in the transverse-axis direction and the first diameter are inclined at an obtuse angle, the first large surface hole and the second large surface hole are alternately disposed in a row in a longitudinal-axis direction of the metal plate, the first large surface hole and the second large surface hole are alternately disposed in a row in the transverse-axis direction of the metal plate, a first island portion is disposed between two adjacent first large surface holes in a first diagonal direction connecting the first diameter of the communication portion connected to the first large surface hole, a second island portion is disposed between two adjacent second large surface holes in a second diagonal direction connecting the first diameter of the communication portion connected to the second large surface hole, a rib is disposed between the first island portion and the second island portion, and a size deviation between the first island portion and the second island portion that are adjacent to each other is 30% or less.

Advantageous Effects

A deposition mask according to an embodiment can improve the uniformity of a pore diameter of the deposition mask.

In detail, in the deposition mask according to the embodiment, the uniformity of large surface holes and small surface holes of the through-holes can be improved regardless of a direction while through-holes including elliptical-shaped through-holes are disposed in a zigzag form.

That is, in the deposition mask according to the embodiment, the uniformity of a shape of the through-holes in a transverse-axis direction, a longitudinal-axis direction, and a diagonal direction can be improved.

Accordingly, the deposition mask according to the embodiment can improve the quality of a deposition pattern.

DESCRIPTION OF DRAWINGS

FIG. 1 is a perspective view illustrating an organic material deposition apparatus including a deposition mask according to an embodiment.

FIG. 2 is a cross-sectional view illustrating the organic material deposition apparatus including the deposition mask according to the embodiment.

FIG. 3 is a view illustrating that the deposition mask according to the embodiment is stretched to be mounted on a mask frame.

FIG. 4 is a view illustrating that a plurality of deposition patterns are formed on a substrate 300 through a plurality of through-holes of the deposition mask.

FIG. 5 is a view illustrating a plan view of the deposition mask according to the embodiment.

FIG. 6 is a view illustrating a plan view of an effective portion of a deposition mask according to Comparative Example.

FIG. 7 is a photograph of the effective portion of the deposition mask according to Comparative Example.

FIG. 8 is a view illustrating a plan view of an effective portion of a deposition mask according to an embodiment.

FIG. 9 is a photograph of the effective portion of the deposition mask according to the embodiment.

FIG. 10 is a view illustrating each cross section in an overlapping manner in order to describe a step and a size in height between a cross section in a A-A' direction and a cross section in a B-B' direction of FIG. 8.

FIG. 11 is a view illustrating a process of forming a large surface hole of the deposition mask according to Comparative Example.

FIG. 12 is a view illustrating a process of forming a large surface hole of the deposition mask according to the embodiment.

FIG. 13 is a view illustrating a size of a deposition pattern in a diagonal direction of Comparative Example.

FIG. 14 is a view illustrating a size of a deposition pattern in a diagonal direction according to the embodiment.

FIGS. 15 and 16 are views illustrating a deposition pattern formed through a deposition mask according to an embodiment.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced. In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (A, and (b) may be used. These terms are only used to distinguish the elements from other elements, and the terms are not limited to the essence, order, or order of the elements.

In addition, when an element is described as being "connected" or "coupled" to another element, it may include not only when the element is directly "connected" or "coupled" to other elements, but also when the element is "connected" or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a deposition mask according to an embodiment will be described with reference to drawings.

FIGS. 1 to 4 are conceptual views for describing a process of depositing an organic material on a substrate 300 using a deposition mask 100 according to an embodiment.

FIG. 1 is a perspective view illustrating an organic material deposition apparatus including a deposition mask according to an embodiment, FIG. 2 is a cross-sectional view illustrating the organic material deposition apparatus including the deposition mask 100 according to the embodiment, and FIG. 3 is a view illustrating that the deposition mask 100 according to the embodiment is stretched to be mounted on a mask frame 200. In addition, FIG. 4 is a view illustrating that a plurality of deposition patterns are formed on the substrate 300 through a plurality of through-holes of the deposition mask 100.

Referring to FIGS. 1 to 4, the organic material deposition apparatus may include the deposition mask 100, the mask frame 200, the substrate 300, an organic material deposition container 400, and a vacuum chamber 500.

The deposition mask 100 may include a metal. For example, the deposition mask may include iron (Fe) and nickel (Ni).

The deposition mask 100 may include a plurality of through-holes TH in an effective portion for deposition. The deposition mask 100 may be a substrate for the deposition mask including the plurality of through-holes TH. In this case, the through-hole may be formed to correspond to a pattern to be formed on the substrate. The deposition mask 100 may include an ineffective portion other than the effective portion including a deposition region.

The mask frame 200 may include an opening 205. The plurality of through-holes of the deposition mask 100 may be disposed on a region corresponding to the opening 205 of the mask frame 200. Accordingly, the organic material supplied to the organic material deposition container 400 may be deposited on the substrate 300. The deposition mask 100 may be disposed and fixed on the mask frame 200. For example, the deposition mask 100 may be stretched with a constant tensile force and fixed on the mask frame 200 by welding.

That is, the mask frame 200 includes a plurality of frames 201, 202, 203, and 204 surrounding the opening 205.

The deposition mask 100 may be stretched in opposite directions at the outermost portion of the deposition mask 100. In the deposition mask 100, one end of the deposition mask 100 and the other end opposite to the one end may be stretched in opposite directions in a longitudinal direction (transverse-axis direction) of the deposition mask 100.

The substrate 300 may be a substrate used for manufacturing a display device. For example, the substrate 300 may be a substrate 300 for depositing an organic material for an OLED pixel pattern. Patterns of red (R), green (G), and blue (B) may be formed on the substrate 300 to form a pixel having three primary colors of light. That is, an RGB pattern may be formed on the substrate 300.

The organic material deposition container 400 may be a crucible. An organic material may be disposed inside the crucible. The organic material deposition container 400 may move in the vacuum chamber 500.

As a heat source and/or current are supplied to the crucible that is the organic material deposition container 400 in the vacuum chamber 500, the organic material may be deposited on the substrate 100.

Referring to FIG. 4, the deposition mask 100 may include one surface 101 and the other surface 102 opposite to the one surface.

The one surface 101 of the deposition mask 100 may include a small surface hole V1, and the other surface 102 may include a large surface hole V2. For example, each of the one surface 101 and the other surface 102 of the deposition mask 100 may include a plurality of small surface holes V1 and a plurality of large surface holes V2.

In addition, the deposition mask 100 may include a through-hole TH. The through-hole TH may be communicated by a communication portion CA to which a boundary between the small surface hole V1 and the large surface hole V2 is connected.

In addition, the deposition mask 100 may include a first inner surface ES1 in the small surface hole V1. The deposition mask 100 may include a second inner surface ES2 in the large surface hole V2. The through-hole TH may be formed by communicating the first inner surface ES1 in the small surface hole V1 and the second inner surface ES2 in the large surface hole V2 with each other. For example, the first inner surface ES1 in one small surface hole V1 may communicate with the second inner surface ES2 in one large surface hole V2 to form one through-hole. Accordingly, the number of the through-holes TH may correspond to the number of the small surface holes V1 and the large surface holes V2.

A width of the large surface hole V2 may be greater than a width of the small surface hole V1. In this case, the width of the small surface hole V1 may be measured on the one surface 101 of the deposition mask 100, and the width of the large surface hole V2 may be measured on the other surface 102 of the deposition mask 100.

The small surface hole V1 may be disposed toward the substrate 300. The small surface hole V1 may be disposed close to the substrate 300. Accordingly, the small surface hole V1 may have a shape corresponding to the deposition material, that is, a deposition pattern DP.

The large surface hole V2 may be disposed toward the organic material deposition container 400. Accordingly, the large surface hole V2 may accommodate the organic material supplied from the organic material deposition container 400 in a wide width, and a fine pattern may be quickly formed on the substrate 300 through the small surface hole V1 having a width smaller than the large surface hole V2.

FIG. 5 is a view illustrating a plan view of the deposition mask 100 according to the embodiment. The deposition mask 100 will be described in more detail with reference to FIG. 5.

Referring to FIG. 5, the deposition mask 100 according to the embodiment may include a deposition region DA and a non-deposition region NDA.

The deposition region DA may be a region for forming a deposition pattern. The deposition region DA may include a pattern region and a non-pattern region. The pattern region may be a region including the small surface hole V1, the large surface hole V2, the through-hole TH, and an island portion IS, and the non-pattern region may be a region not including the small surface hole V1, the large surface hole V2, the through-hole TH, and the island portion IS.

In addition, one deposition mask 100 may include a plurality of deposition regions DA. For example, the deposition region DA of the embodiment may include a plurality of effective portions AA1, AA2, and AA3 capable of forming a plurality of deposition patterns.

The deposition region DA may include a plurality of isolation regions IA1 and IA2 included in one deposition mask 100. Isolation regions IA1 and IA2 may be disposed between adjacent effective portions. That is, adjacent effective regions may be distinguished from each other by the isolation regions IA1 and IA2, and one deposition mask 100 may support a plurality of effective regions.

The deposition mask 100 may include the non-deposition region NDA in both sides in a longitudinal direction of the deposition region DA. The deposition mask 100 according to the embodiment may include the non-deposition region NDA on both sides in a horizontal direction of the deposition region DA.

The non-deposition region NDA may include frame fixing regions FA1 and FA2 for fixing the deposition mask 100 to the mask frame 200, half-etched portions HF1 and HF2, and an open portion.

The non-deposition region NDA may include the half-etched portions HF1 and HF2. For example, the non-deposition region NDA of the deposition mask 100 may include a first half-etched portion HF1 on one side of the deposition region DA and may include a second half-etched portion HF2 on the other side opposite to the one side of the deposition region DA. The first half-etched portion HF1 and the second half-etched portion HF2 may be regions in which grooves are formed in a depth direction of the deposition mask 100. The first half-etched portion HF1 and the second half-etched portion HF2 may have a groove having a depth of about ½ of a thickness of the deposition mask, so that stress may be dispersed during stretching the deposition mask 100.

The deposition mask 100 according to the embodiment may include a plurality of half-etched portions. In detail, the deposition mask 100 according to the embodiment is illustrated as including the half-etched portions HF1 and HF2 only in the non-deposition region NDA, but the embodiment is not limited thereto, and at least one of the deposition region DA and the non-deposition region NDA may further include a plurality of half-etched portions. Accordingly, the stress of the deposition mask 100 may be uniformly dispersed.

The non-deposition region NDA may include the frame fixing regions FA1 and FA2 for fixing the deposition mask 100 to the mask frame 200.

The frame fixing regions FA1 and FA2 may be disposed between the half-etched portions HF1 and HF2 of the non-deposition region NDA and the effective portion of the deposition region DA adjacent to the half-etched portions HF1 and HF2. For example, the first frame fixing region FA1 may be disposed between the first half-etched portion HF1 of the non-deposition region NDA and a first effective portion AA1 of the deposition region DA adjacent to the first half-etched portion HF1. For example, the second frame fixing region FA2 may be disposed between the second half-etched portion HF2 of the non-deposition region NDA and a third effective portions AA3 of the deposition region DA adjacent to the second half-etched portion HF2. Accordingly, it is possible to simultaneously fix a plurality of deposition pattern portions.

In addition, the deposition mask 100 may include semicircular openings at both ends in a horizontal direction X. For example, the non-deposition region NDA may include the open portion.

In addition, although not shown in the drawings, the half-etched portion may be further formed in an ineffective portion UA of the deposition region DA. A plurality of the half-etched portions may be dispersed in all or part of the ineffective portion UA to disperse stress during stretching the deposition mask 100.

In addition, the half-etched portions HF1 and HF2 may be formed in the frame fixing regions FA1 and FA2 and/or in the peripheral regions of the frame fixing regions FA1 and FA2. Accordingly, stress of the deposition mask 100 generated when the deposition mask 100 is fixed to the mask frame 200 and/or when the deposition material is deposited after fixing the deposition mask 100 to the frame may be uniformly dispersed. Accordingly, the deposition mask 100 may be maintained to have uniform through-holes.

The deposition mask 100 may include the plurality of effective portions AA1, AA2, and AA3 spaced apart in the longitudinal direction and the ineffective portions UA other than the effective portions. In detail, the deposition region DA may include a plurality of effective portions AA1, AA2, and AA3 and the ineffective portions UA other than the effective portions AA.

The effective portions AA1, AA2, AA3 may include the plurality of small surface holes V1 formed on one surface of the deposition mask 100, the plurality of large surface holes V2 formed on the other surface opposite to the one surface, and the through-hole TH formed by the communication portion CA to which the boundary between the small surface hole V1 and the large surface hole V2 is connected.

In addition, the effective portions AA1, AA2, and AA3 may include the island portion IS for supporting between the plurality of through-holes TH.

The island portion IS may be positioned between adjacent through-holes TH among the plurality of through-holes TH. That is, in the effective portions AA1, AA2, and AA3 of the deposition mask 100, a region other than the through-hole TH may be the island portion IS.

The island portion IS may refer to a portion that is not etched on one surface 101 or the other surface 102 of the effective portion of the deposition mask. In detail, the island portion IS may be an unetched region between the through-hole TH and the through-hole TH on the other surface 102 on which the large surface hole V2 of the effective portion of the deposition mask 100 is formed. Therefore, the island portion IS may be disposed parallel to the other surface 102 of the deposition mask 100. In detail, an upper surface of the island portion IS may be disposed parallel to the other surface 102.

The island portion IS may be disposed on the same plane as the other surface 102 of the deposition mask 100. Accordingly, the island portion IS may have the same thickness as at least a portion of the ineffective portion on the other surface 102 of the deposition mask 100. In detail, the island portion IS may have the same thickness as an unetched portion of the ineffective portion on the other surface 102 of the deposition mask 100. Accordingly, the deposition uniformity of sub-pixels may be improved through the deposition mask 100.

Alternatively, the island portion IS may be disposed on a plane parallel to the other surface 102 of the deposition mask 100. Here, the parallel plane may include that a height difference between the other surface of the deposition mask 100 on which the island portion IS is disposed by the etching process around the island portion IS and the other surface of the non-etched deposition mask 100 among the ineffective portions is ±1 μm or less.

The island portion IS may have a width W1 in the longitudinal direction and a width in the horizontal direction different from each other. That is, the island portion IS may have the width in the longitudinal direction greater than the width in the horizontal direction. In more detail, the island portion IS may have a width parallel to the longitudinal direction of the deposition mask greater than a width parallel to a width direction of the deposition mask.

The deposition mask 100 may include the ineffective portion UA disposed at an outer portion of the effective portions AA1, AA2, and AA3. The effective portion AA may be an inner region when the outer portions of the through-holes positioned at the outermost portion for depositing the organic material among the plurality of through-holes are connected. The ineffective portion UA may be an outer region when the outer portions of the through-holes positioned at the outermost portion for depositing the organic material among the plurality of through-holes are connected.

The ineffective portion UA is a region excluding the effective portions AA1, AA2, and AA3 in the deposition region DA and the non-deposition region NDA. The ineffective portion UA may include outer regions OA1, OA2, and OA3 surrounding the outer portion of the effective portions AA1, AA2, and AA3.

The number of the outer regions OA1, OA2, and OA3 may correspond to the number of the effective portions AA1, AA2, and AA3. That is, one effective portion may include one outer region respectively separated by a predetermined distance in horizontal and vertical directions from an end of the effective portion.

The first effective portion AA1 may be included in a first outer region OA1. The first effective portion AA1 may include a plurality of through-holes TH for forming a deposition material. The first outer region OA1 surrounding an outer portion of the first effective portion AA1 may include a plurality of through-holes.

For example, the plurality of through-holes included in the first outer region OA1 is to reduce etching defects of through-holes TH positioned at the outermost portion of the first effective portion AA1. Accordingly, the deposition mask 100 according to the embodiment may improve the uniformity of the plurality of through-holes positioned in the effective portions AA1, AA2, and AA3, thereby improving the quality of the deposition pattern manufactured.

In addition, a shape of the through-hole TH of the first effective portion AA1 may correspond to a shape of the through-hole TH of the first outer region OA1. Accordingly, the uniformity of the through-hole TH included in the first effective portion AA1 may be improved. As an example, the shape of the through-hole TH of the first effective portion AA1 and the shape of the through-hole of the first outer region OA1 may be circular. However, the embodiment is not limited thereto, and the through-hole TH may have various shapes such as a diamond pattern, an elliptical pattern, and the like.

The second effective portion AA2 may be included in a second outer region OA2. The second effective portion AA2 may have a shape corresponding to that of the first effective portion AA1. The second outer region OA2 may have a shape corresponding to that of the first outer region OA1.

The second outer region OA2 may further include two through-holes in each of the horizontal direction and the vertical direction from a through-hole positioned at the outermost portion of the second effective portion AA2. For example, in the second outer region OA2, two through-holes may be disposed in a row in the horizontal direction at each of positions of upper and lower portions of the through-hole positioned at the outermost portion of the second effective portion AA2. For example, in the second outer region OA2, two through-holes may be disposed in a row in the vertical direction at each of left and right sides of the through-hole positioned at the outermost portion of the second effective portion AA2. The plurality of through-holes included in the second outer region OA2 are to reduce etching defects of the through-holes positioned at the outermost portion of the effective portion. Accordingly, the deposition mask according to the embodiment may improve the uniformity of the plurality of through-holes positioned in the effective portion, thereby improving the quality of the deposition pattern manufactured.

The third effective portion AA3 may be included in a third outer region OA3. The third effective portion AA3 may include a plurality of through-holes for forming a deposition material. The third outer region OA3 surrounding an outer portion of the third effective portion AA3 may include a plurality of through-holes.

The third effective portion AA3 may have a shape corresponding to that of the first effective portion AA1. The third outer region OA3 may have a shape corresponding to that of the first outer region OA1.

In addition, through-holes TH included in the effective portions AA1, AA2 and AA3 may have a shape partially corresponding to through-holes included in the ineffective portion UA. As an example, the through-holes included in the effective portions AA1, AA2 and AA3 may have different shapes from through-holes positioned at an edge portion of the ineffective portion UA. Accordingly, the difference in stress according to a position of the deposition mask 100 may be adjusted.

Structural characteristics of a deposition mask according to an embodiment will be described by comparing FIGS. 6 to 9.

FIGS. 6 and 7 are views illustrating a plan view of an effective portion of a deposition mask 100 according to Comparative Example.

When the through-hole of the deposition mask has a symmetrical shape, the uniformity of the island portion may be high. For example, a deposition mask having a circular through-hole may have a high uniformity of the through-hole regardless of a direction, and a size of the island portion may be uniform. Accordingly, the uniformity of the deposition pattern manufactured through the deposition mask may be high, and the quality of the deposition pattern may be high.

Meanwhile, as in Comparative Examples of FIGS. 6 and 7, when the through-hole of the deposition mask has an asymmetric shape, there is a problem that the uniformity of the size of the island portion is deteriorated. Here, the asymmetric shape may refer that the elliptical-shaped through-holes are disposed in a first diagonal direction different from the transverse-axis direction and the longitudinal-axis direction of the deposition mask and a second diagonal direction different from the first diagonal direction. That is, in the deposition mask of the Comparative Example, a direction transverse to a maximum diameter of a plurality of elliptical-shaped through-holes may be the first diagonal direction different from the transverse-axis direction and the longitudinal-axis direction of the deposition mask. In addition, the direction transverse to the maximum diameter of the plurality of elliptical-shaped through-holes may be the second diagonal direction different from the transverse-axis direction, the longitudinal-axis direction, and the first diagonal direction of the deposition mask. Accordingly, a size deviation may occur in the island portion positioned on a line extending a center in a direction of the maximum or minimum diameter of adjacent elliptical-shaped through-holes according to a cross-sectional direction. That is, in the deposition mask according to Comparative Example, the uniformity of the shape of the through-hole may be deteriorated according to a cross-sectional direction of a diagonal line. In addition, in the deposition mask according to Comparative Example, the size deviation of the island portion may be large according to the cross-sectional direction of the diagonal line. Accordingly, in the deposition mask according to the Comparative Example, there is a problem that the quality of the deposition pattern is low.

An object of the embodiment is to reduce the size deviation of the through-hole and the size deviation of the island portion in the deposition mask having the asymmetrical-shaped through-hole. Accordingly, the embodiment may improve the uniformity of the through-holes in different diagonal directions in the deposition mask having the asymmetrical-shaped through-holes. The through-holes of the deposition mask according to the embodiment may have the elliptical shape disposed in a zigzag form and have a uniform size in the transverse-axis direction, the longitudinal-axis direction, the first diagonal direction, and the second diagonal direction. In addition, the island portion positioned between the through-holes of the deposition mask according to the embodiment may have a uniform size in the transverse-axis direction, the longitudinal-axis direction, the first diagonal direction, and the second diagonal direction. Accordingly, the deposition mask according to the embodiment may have uniform through-holes, and thus the quality of the deposition pattern manufactured may be excellent.

Hereinafter, effects of the present invention will be described in detail with reference to FIGS. 6 to 9.

Referring to FIGS. 6 and 7, in the deposition mask according to Comparative Example, as a pattern of the large surface holes has an elliptical shape inclined at different angles, there is a problem that the island portion is not uniform.

For example, a size of a first island portion IS1 positioned in a first diagonal direction I1 may be greater than a size of a second island portion IS2 positioned in a second diagonal direction I2.

Accordingly, a size deviation between adjacent first island portions IS1 and second island portions IS2 may exceed 30%. For example, a size deviation of the first island portion and the second island portion disposed in a row in the longitudinal-axis direction may exceed 20%. A size deviation of the first island portion and the second island portion disposed in a row in the transverse-axis direction may exceed 10%. Accordingly, in the deposition mask of the Comparative Example, there is a problem that the uniformity of the deposition pattern is deteriorated according to a deposition direction.

FIGS. 8 and 9 are views illustrating a plan view of an effective portion of a deposition mask 100 according to an embodiment.

FIGS. 6 to 9 may be plan views of any one of the first effective portion AA1, the second effective portion AA2, and the third effective portion AA3 of the deposition mask 100. In addition, FIGS. 8 and 9 are views for describing a shape of a through-hole TH and the arrangement between the through-holes TH according to the embodiment, and the deposition mask 100 according to the embodiment is not limited to the number of through holes TH shown in the drawings.

Referring to FIGS. 8 and 9, the deposition mask 100 may include a plurality of through-holes TH including communication portions CA. In this case, the communication portions CA of the plurality of through-holes may have an elliptical shape. A diameter in one direction and a diameter in the other direction of the communication portion CA may be different from each other.

The communication portion CA of the through-hole TH may have an elliptical shape having a first diameter D1 and a second diameter D2 different from the first diameter. Here, the first diameter D1 may refer to a maximum diameter of the elliptical shape, and the second diameter D2 may refer to a minimum diameter of the elliptical shape. In this case, a direction of the first diameter D1 and a direction of the second diameter D2 may have an angle of 90 degrees or an angle similar angle thereto. Here, the similar angle may refer to a difference of less than 2 degrees before and after 90 degrees. Alternatively, the similar angle herein may refer to a difference of less than 1 degree before and after 90 degrees. Alternatively, the similar angle herein may refer to a difference of less than 0.5 degrees before and after 90 degrees.

The large surface hole and the communication portion may have different shapes. For example, the communication portion may be formed in the elliptical shape as described above. In addition, the large surface hole may be formed in a circular shape. That is, in the communication portion, a diameter in one direction and a diameter in the other direction may be different from each other, and in the large surface hole, a diameter in one direction and a diameter in the other direction may be the same or similar to each other.

A size deviation between the first large surface hole and the second large surface hole may be 10% or less. The size deviation between the first large surface hole and the second large surface hole may be 5% or less. The size deviation between the first large surface hole and the second large surface hole may be 3% or less. When the size deviation of the first large surface hole and the second large surface hole exceeds 10%, deposition efficiency may be deteriorated, and the quality of a deposition pattern manufactured through a deposition mask may be deteriorated.

The first diameter may be 50 μm or less. For example, the first diameter may be 40 μm or less. For example, the first diameter may be 30 μm or less.

A difference between the first diameter D1 and the second diameter D2 may be 10 μm or less. The difference between the first diameter D1 and the second diameter D2 may be 7 μm or less. The difference between the first diameter D1 and the second diameter D2 may be 5 μm or less. When the difference between the first diameter D1 and the second diameter D2 exceeds 10 μm, the size deviation of the island portions positioned in different diagonal directions increases, and thus the deposition quality may be deteriorated.

A ratio of the second diameter D2 to the first diameter D1 (second diameter/first diameter) may be between 0.7 and 0.93. As an example, the first diameter D1 may be 40 μm, the second diameter D2 may be 30 μm, and the ratio of the second diameter D2 to the first diameter D1 may be 0.75 (30/40).

A ratio of the first island portion IS1 to the second island portion IS2 (size of the first island portion/size of the second island portion) may be 0.6 to 0.9. As an example, a size of the first island portion IS1 may be 34.0 μm, a size of the second island portion IS2 may be 22 μm, and the ratio of the first island portion IS1 to the second island portion IS2 may be about 0.65.

The communication portion of the through-hole TH may have an elliptical shape that is disposed to be inclined at a predetermined angle. The communication portions of the plurality of through-holes may be respectively disposed in the elliptical shape. In the communication portions of the plurality of through-holes, an elliptical shape inclined in a first diagonal direction OL1 and an elliptical shape inclined in a second diagonal direction OL2 may be alternately disposed.

For example, the communication portions of the plurality of through-holes may be disposed to be spaced apart in a zigzag form in the longitudinal direction (transverse-axis direction). In detail, in the communication portions of the plurality of through-holes, the elliptical shape inclined in the first diagonal direction OL1 and the elliptical shape inclined in the second diagonal direction OL2 may be alternately disposed in the longitudinal direction, and an imaginary extension line connecting the maximum diameter direction of the elliptical shape inclined in the first diagonal direction OL1 and the elliptical shape inclined in the second diagonal direction OL2 may have a zigzag shape Z1.

For example, the communication portions of the plurality of through-holes may be disposed to be spaced apart in a zigzag form in a direction (longitudinal-axis direction) perpendicular to the longitudinal direction of the metal plate. In detail, in the communication portions of the plurality of through-holes, the elliptical shape inclined in the first diagonal direction OL1 and the elliptical shape inclined in the second diagonal direction OL2 may be alternately disposed in the longitudinal direction, and an imaginary extension line connecting the maximum diameter direction of the elliptical shape inclined in the first diagonal direction OL1 and the elliptical shape inclined in the second diagonal direction OL2 may have a zigzag shape Z2.

For example, the communication portion of the through-hole may be disposed while having an inclination at a predetermined angle. In detail, a vertical direction of the communication portion of the through-hole may be disposed to be inclined at a predetermined angle with respect to a width direction of the metal plate.

Here, the first diagonal direction OL1 may be a direction of an imaginary line connecting the maximum diameter of an elliptical shape inclined in a first direction. The second diagonal direction OL2 may be a direction of an imaginary line connecting the maximum diameter of an elliptical shape inclined in a second direction. The first diagonal direction OL1 and the second diagonal direction OL2 may cross each other.

For example, when an angle between the first diagonal direction OL1 and one end of the deposition mask in the transverse-axis direction is an acute angle, an angle between the second diagonal direction OL2 and one end of the deposition mask in the transverse-axis direction may be an obtuse angle. For example, when the angle between the first diagonal direction OL1 and one end of the deposition mask in the transverse-axis direction is an obtuse angle, the angle between the second diagonal direction OL2 and one end of the deposition mask in the transverse-axis direction may be an acute angle.

For example, in the communication portion of the through-hole, a vertical direction of the through-hole may be disposed to be inclined at an angle of 1° to 60° or −1° to −60° with respect to the width direction of the metal plate. For example, in the communication portion of the through-hole, the vertical direction of the communication portion may be disposed to be inclined at an angle of 1° to 45° or −1° to −45° with respect to the width direction of the metal plate. For example, in the communication portion of the through-hole, the vertical direction of the communication portion may be disposed to be inclined at an angle of 1° to 10° or −1° to −10° with respect to the width direction of the metal plate.

An imaginary line connecting a first diameter D1 of the communication portion connected to a first large surface hole V2-1 disposed in a row in the longitudinal-axis direction and a first diameter D1 of the communication portion connected to a second large surface hole V2-2 may have a zigzag shape.

An imaginary line connecting the first diameter D1 of the communication portion connected to the first large surface hole V2-1 disposed in a row in the transverse-axis direction and the first diameter D1 of the communication portion connected to the second large surface hole V2-2 may have a zigzag shape.

The large surface hole may include the first large surface hole V2-1 connected to the communication portion in which one surface of the deposition mask in the transverse-axis direction and the first diameter D1 is inclined at an acute angle and the second large surface hole V2-2 connected to the communication portion in which one surface of the deposition mask in the longitudinal direction and the first diameter D1 is inclined at an obtuse angle.

The first large surface hole V2-1 and the second large surface hole V2-2 may be alternately disposed in a row in the longitudinal-axis direction.

The first large surface holes V2-1 and the second large surface holes V2-2 may be alternately disposed in a row in the transverse-axis direction.

A communication portion of two adjacent through-holes in the transverse-axis direction and a communication portion of two through-holes positioned in the longitudinal-axis direction of each of the two through-holes may form a pinwheel-shaped through-hole set SET. For example, a communication portion set of four through-holes constituted of a communication portion connected to two adjacent first large surface holes V2-1 in the longitudinal-axis and transverse-axis directions and a communication portion connected to the two second large surface holes V2-2 may have a pinwheel shape.

The communication portion of the first through-hole and the communication portion of the second through-hole that are adjacent in the transverse-axis direction in one set of through-holes may have a shape facing each other with a mirror interposed therebetween. The communication portion of the third through-hole and the communication portion of the fourth through-hole that are adjacent in the transverse-axis direction in one set of through-holes may have a shape facing each other with a mirror interposed therebetween. In addition, the communication portion of the first through-hole and the communication portion of the third through-hole that are adjacent in the longitudinal-axis direction in one set of through-holes may have a shape facing each other with a mirror interposed therebetween. The communication portion of the second through-hole and the communication portion of the fourth through-hole that are adjacent in the longitudinal-axis direction in one set of through-holes may have a shape facing each other with a mirror interposed therebetween.

The four through-hole sets SET in which the communication portion has a pinwheel shape may be disposed in a row in the transverse-axis direction and the longitudinal-axis direction of the deposition mask. For example, the four through-hole sets SET having the pinwheel shape may include a first through-hole set SET1 and a second through-hole set SET2. The first through-hole set SET1 and the second through-hole set SET2 may be disposed in a row in the transverse axis. The first through-hole set SET1 and the second through-hole set SET2 may be disposed in a row in the longitudinal axis.

The first island portion IS1 may be positioned between the first through-hole set SET1 and the second through-hole set SET2. The second island portion IS2 may be positioned at a center of four through-holes in the first through-hole set SET1. The second island portion IS2 may be positioned at a center of four through-holes in the second through-hole set SET2.

In the four through-hole sets SET, the two through-holes adjacent in the transverse-axis direction may refer to a first elliptical through-hole including the elliptical-shaped communication portion disposed in the first diagonal direction OL1 and a second elliptical through-hole including the elliptical-shaped communication portion disposed in the second diagonal direction OL2. The two through-holes positioned in the longitudinal-axis direction of each of the two through-holes may include a third elliptical through-hole including the elliptical-shaped communication portion disposed in the second diagonal direction OL2 positioned in the longitudinal-axis direction of the first elliptical through-hole and a fourth elliptical through-hole including the elliptical-shaped communication portion disposed in the first diagonal direction OL1 positioned in the longitudinal-axis direction of the second elliptical through-hole.

When the through-holes TH are disposed in a row on the longitudinal axis and the transverse axis, respectively, the island portion IS may be positioned between two adjacent through-holes TH in the diagonal direction that is a direction intersecting both the longitudinal axis and the transverse axis. That is, the island portion IS may be positioned between two adjacent through-holes TH positioned in the diagonal direction.

For example, the island portion IS may be disposed between the first through-hole TH1 and the fourth through-hole TH4. In addition, the island portion IS may be disposed between the second through-hole TH2 and the third through-hole TH3.

The island portion IS may be positioned in an inclination angle direction of about +45 degrees and an inclination angle direction of about −45 degrees based on the transverse axis crossing two adjacent through-holes, respectively. Here, the inclination angle direction of about ±45 may refer to a diagonal direction between the transverse axis and the longitudinal axis, and an inclination angle in the diagonal direction may be measured on the same plane of the transverse axis and the longitudinal axis.

The first island portion IS1 may be disposed between two adjacent first large surface holes V2-1 in the first diagonal direction I1 connecting the second diameter D2 of the communication portion connected to the first large surface hole V2-1.

The second island portion IS2 may be disposed between two adjacent second large surface holes V2-2 in the second diagonal direction I2 connecting the first diameter D1 of the communication portion connected to the second large surface hole V2-1.

A size deviation between the adjacent first island portion IS1 and the second island portion IS2 may be 30% or less. The size deviation between the adjacent first island portion IS1 and the second island portion IS2 may be 20% or less. The size deviation between the adjacent first island portions IS1 and the second island portions IS2 may be 10% or less. In the deposition mask of the embodiment, the size deviation between the adjacent first island portions IS1 and the second island portions IS2 may be 30% or less, and thus the uniformity of the size of the through-holes may be improved.

The first island portion IS1 and the second island portion IS2 may be alternately disposed in a row in the longitudinal-axis direction. The first island portion IS1 and the second island portion IS2 may be alternately disposed in a row in the transverse-axis direction.

A size deviation between the adjacent first island portions IS1 and the second island portions IS2 measured in the longitudinal-axis direction or the transverse-axis direction may be 50% or less. For example, the size deviation between the adjacent first island portions IS1 and the second island portions IS2 measured in the longitudinal-axis direction or the transverse-axis direction may be 30% or less. For example, the size deviation between the adjacent first island portions IS1 and the second island portions IS2 measured in the longitudinal-axis direction or the transverse-axis direction may be 10% or less. When the size deviation between the adjacent first island portions IS1 and the second island portions IS2 measured in the longitudinal-axis direction or the transverse-axis direction exceeds 50%, there is a problem that the size of the deposition pattern differs according to the diagonal direction.

The island portion IS of FIGS. 6 to 9 may refer to a non-etched surface between the through-holes TH on the other surface 102 of the deposition mask 100 in which the large surface hole V2 of the effective portion AA is formed. In detail, the island portion IS may be the other surface of the deposition mask 100 that is not etched except for the second inner surface ES2 positioned in the large surface hole and the through-hole TH in the effective portion AA of the deposition mask.

Referring to FIGS. 8 and 9, in the deposition mask according to the embodiment, the uniformity of the island portion may be improved while a pattern of the communication portion has an elliptical shape inclined at different angles.

For example, a size of the first island portion I1 positioned in the first diagonal direction I1 may be the same as or similar to a size of the second island portion IS2 positioned in the second diagonal direction I2. A size deviation between the size of the first island portion I1 and the size of the second island portion IS2 may be 50% or less. Here, the similarity in size may refer that the size deviation between the size of the first island portion I1 and the size of the second island portion IS2 is 30% or less. For example, a size deviation of the first island portion and the second island portion disposed in a row in the longitudinal-axis direction may be 20% or less. A size deviation of the first island portion and the second island portion disposed in a row in the transverse-axis direction may be 10% or less.

In the deposition mask of the embodiment, the uniformity of the deposition pattern may be improved regardless of the deposition direction. That is, in the deposition mask of the embodiment, a deviation between the size of the two island portions adjacent to the transverse-axis direction, the size of the two island portions adjacent to the longitudinal-axis direction, and the size of the two island portions adjacent to the diagonal direction may be 50% or less and 30% or less, and thus the uniformity of the deposition pattern may be improved.

The deposition mask 100 of the embodiment may be for deposition of high-resolution to ultra-high-resolution OLED pixels having a resolution of 400 PPI or more. The deposition mask 100 of the embodiment may be for deposition of high-resolution to ultra-high-resolution OLED pixels having a resolution of 600 PPI or more. The deposition mask 100 of the embodiment may be for deposition of high-resolution to ultra-high-resolution OLED pixels having a resolution of 700 PPI or more. The deposition mask 100 of the embodiment may be for deposition of high-resolution to ultra-high-resolution OLED pixels having a resolution of 800 PPI or more.

For example, the deposition mask 100 of the embodiment may be for forming a deposition pattern having a high resolution of Full HD (High Definition) having a resolution of 400 PPI or more. For example, the deposition mask 100 of the embodiment may be for deposition of an OLED pixel in which the number of pixels in the horizontal and vertical directions is 1920*1080 or more and 400 PPI or more. That is, one effective portion included in the deposition mask 100 of the embodiment may be for forming the number of pixels having a resolution of 1920*1080 or more.

For example, the deposition mask 100 of the embodiment may be for forming a deposition pattern having a high resolution of quad high definition (QHD) having a resolution of 500 PPI or more. For example, the mask 100 for deposition according to the embodiment may be for deposition of an OLED pixel in which the number of pixels in the horizontal and vertical directions is 2560*1440 or more and 530 PPI or more. Through the deposition mask 100 of the embodiment, the number of pixels per inch may be 530 PPI or more based on a 5.5-inch OLED panel. That is, one effective portion included in the deposition mask 100 of the embodiment may be for forming the number of pixels having a resolution of 2560*1440 or more.

For example, the deposition mask 100 of the embodiment may be for forming a deposition pattern having an ultra-high resolution of ultra-high definition (UHD) having a resolution of 700 PPI or more. For example, the deposition mask 100 of the embodiment may be for forming a deposition pattern having a resolution of ultra-high definition (UHD) for deposition of an OLED pixel in which the number of pixels in the horizontal and vertical directions is 3840*2160 or more and 794 PPI or more.

A diameter of the through-hole TH may be a width between the communication portions CA. In detail, the diameter of the through-hole TH may be measured at a point where an end of an inner surface in the small surface hole V1 meets an end of an inner surface in the large surface hole V2.

The first diameter D1 defined as the maximum diameter of the through-hole TH may be 33 μm or less. Here, the diameter may refer to an average diameter of various through-holes. Therefore, the deposition mask 100 according to the embodiment may implement QHD-level resolution. For example, the first diameter D1 may be about 15 μm to about 33 μm. For example, the first diameter D1 may be about 19 μm to about 33 μm. For example, the first diameter D1 may be about 20 μm to about 27 μm. When the first diameter D1 exceeds about 33 μm, it may be difficult to implement a resolution of 500 PPI or more. Meanwhile, when the first diameter D1 is less than about 15 μm, a deposition defect may occur.

In addition, as shown in FIG. 9, the large surface holes V2: V2-1 and V2-2 may include a plurality of inner surfaces. In detail, the large surface hole V2 may include a 2-1 inner surface ES2-1 and a 2-2 inner surface ES2-2. The large surface hole is formed by connecting a plurality of 2-1 inner surfaces ES2-1 and a plurality of 2-2 inner surfaces ES2-2. The plurality of 2-1 inner surfaces ES2-1 and the plurality of 2-2 inner surfaces ES2-2 form a large surface hole of one through-hole.

The 2-1 inner surface ES2-1 of the large surface hole is an inner surface positioned in the first diameter D1 direction based on a center of the large surface hole of the through-hole. Preferably, the 2-1 inner surface ES2-1 is an inner surface positioned on both sides in a maximum diameter direction based on the center of the large surface hole. Therefore, the 2-1 inner surface ES2-1 includes a first sub 2-1 inner surface adjacent to one end of the first diameter based on the center of the large surface hole of the through-hole and a second sub 2-1 inner surface positioned at the other end opposite to the one end of the first diameter. Meanwhile, a cross-sectional inclination angle of the first sub 2-1 inner surface may correspond to a cross-sectional inclination angle of the second sub 2-1 inner surface.

The 2-2 inner surface ES2-2 of the large surface hole is an inner surface positioned in the second diameter D2 direction based on the center of the large surface hole of the through-hole. Preferably, the 2-2 second inner surface ES2-2 is an inner surface positioned on both sides in the minimum diameter direction based on the center of the large surface hole. Therefore, the 2-2 inner surface ES2-2 includes a first sub 2-2 inner surface positioned at one end of the second diameter based on the center of the large surface hole of the through-hole and a second sub 2-2 inner surface positioned at the other end opposite to the one end of the second diameter. Meanwhile, a cross-sectional inclination angle of the first sub 2-2 inner surface may correspond to a cross-sectional inclination angle of the second sub 2-2 inner surface.

The 2-1 inner surface ES2-1 and the 2-2 inner surface ES2-2 may be surfaces formed by an etching factor during an etching process. The 2-1 inner surface ES2-1 and the 2-2 inner surface ES2-2 may be inner surfaces extending from the through-hole TH to the other surface 102 of the deposition mask 100. For example, the 2-1 inner surface ES2-1 and the 2-2 inner surface ES2-2 may extend from the end of the through-hole TH toward the adjacent through-hole TH and extend toward the island portion IS. In addition, the 2-1 inner surface ES2-1 and the 2-2 inner surface ES2-2 may extend toward the ineffective portion UA. That is, the 2-1 inner surface ES2-1 and the 2-2 inner surface ES2-2 may extend in a direction in which a non-etched surface is formed among the other surfaces 102 of the deposition mask 100.

Ribs RB1 and RB2 may be positioned between the through-holes TH. A rib RB may be positioned between the through-holes TH adjacent to each other. In detail, the ribs RB may be positioned between the large surface holes V2 adjacent to each other. In more detail, the rib RB may be positioned in a region where the 2-1 inner surfaces ES2-1 adjacent to each other are connected to each other. In more detail, the rib RB may be positioned in a region where the 2-2 inner surfaces ES2-2 adjacent to each other are connected to each other. That is, the rib RB may be a region where boundaries of the large surface holes V2 adjacent to each other are connected.

The deposition mask 100 according to the embodiment may deposit an OLED pixel having a resolution of 400 PPI or more. In detail, in the deposition mask 100 according to the embodiment, the diameter of the through-holes TH is about 33 μm or less, and a pitch between the through-holes TH is about 48 μm or less, and thus an OLED pixel having a resolution of 500 PPI or more may be deposited. That is, it is possible to implement QHD-level resolution using the deposition mask 100 according to the embodiment.

The diameter of the through-hole TH and the pitch between the through-holes TH may be a size for forming a green sub-pixel. For example, the diameter of the through-hole TH may be measured based on a green (G) pattern. Since the green (G) pattern has a low recognition rate through vision, more patterns are required than a red (R) pattern and a blue (B) pattern, and the pitch between the through-holes TH may be smaller than the red (R) pattern and the blue (B) pattern. The deposition mask 100 may be an OLED deposition mask for realizing QHD display pixels.

FIG. 10 is a view illustrating each cross section in an overlapping manner in order to describe a step and a size in height between a cross section in a A-A' direction and a cross section in a B-B' direction of FIG. 8.

First, a horizontal cross section in the A-A' direction will be described. The A-A' direction is a horizontal cross section crossing a central region between two adjacent first through-holes TH1 and TH3 in the vertical direction. That is, the horizontal cross section in the A-A' direction may not include the through-holes TH.

The island portion IS may be positioned in the horizontal cross section in the A-A' direction. Accordingly, the island portion IS may include a surface parallel to one surface of the deposition mask that is not etched. Alternatively, the island portion IS may include a surface that is the same as or parallel to the other surface of the deposition mask 100 that is not etched.

Next, a horizontal cross section in the B-B direction will be described. The direction B-B' is a horizontal cross section crossing a center of each of the two adjacent first through-holes TH1 and TH2 in the horizontal direction. That is, the horizontal cross section in the B-B' direction may include a plurality of through-holes TH.

The rib RB that is a region where an etched surface in the large surface holes and an etched surface in the adjacent large surface holes are connected to each other may be positioned in the horizontal cross section in the B-B' direction. Here, the rib RB may be a region where a boundary between two adjacent large surface holes is connected. Since the rib RB is an etched surface, a thickness of the rib RB may be smaller than that of the island portion IS.

For example, a width of the island portion may be 2 μm or more. That is, a long width of the island portion IS may be 2 μm or more. When a width of one end and the other end of one island portion is 2 μm or more, the entire volume of the deposition mask may be increased. The deposition mask having such a structure may ensure sufficient rigidity with respect to the tensile force applied in an organic material deposition process, and the like and may be advantageous in maintaining the uniformity of the through-holes.

A process of forming a large surface hole of Example and Comparative Example is compared with reference to FIGS. 11 to 13.

FIG. 11 is a view illustrating a cross section in the first diagonal direction I1 of Comparative Example according to FIGS. 6 and 7.

Referring to FIGS. 6, 7 and 11, the size of the first island portion IS1 in the first diagonal direction I1 according to the Comparative Example may be greater than the size of the second island portion IS2 in the second diagonal direction I2. The size of the first island portion IS1 in the first diagonal direction I1 is greater than the size of the second island portion IS2 in the second diagonal direction I2. Accordingly, a size of a second diameter D2' of the large surface hole V2 positioned in the first diagonal direction I1 may be smaller than a size of the second diameter D2 of the large surface hole V2 positioned in the second diagonal direction I2. That is, in the deposition mask according to the Comparative Example, the size of the island portion is different according to the diagonal direction and the size deviation of the large surface hole is large, and thus there is a problem that deposition efficiency is deteriorated.

FIG. 12 is a view illustrating a cross section in the first diagonal direction I1 of the embodiment according to FIGS. 8 and 9.

Referring to FIGS. 8, 9 and 12, the size of the first island portion IS1 in the first diagonal direction I1 according to the embodiment may be the same as or similar to the size of the second island portion IS2 in the second diagonal direction I2. Here, the similarity in size may refer that the size deviation between the size of the first island portion IS1 and the size of the second island portion IS2 is 30% or less.

FIG. 12 is a view illustrating a size difference between the second diameter D2' of the large surface hole V2 of the Comparative Example and the second diameter D2 of the large surface hole V2 of the embodiment that are measured in the first diagonal direction I1 in an overlapping manner.

Referring to FIG. 12, the size of the first island portion IS1 in the first diagonal direction I1 may be the same as or similar to the size of the second island portion IS2 in the second diagonal direction I2. Accordingly, the second diameter D2 of the large surface hole V2 positioned in the first diagonal direction I1 may be the same as or similar to the second diameter D2 of the large surface hole V2 positioned in the second diagonal direction I2. That is, in the deposition mask according to the embodiment, the size of the island portion is uniform regardless of the diagonal direction and the size deviation of the large surface hole is small, and thus deposition efficiency may be improved.

FIG. 12 illustrates a size difference between an open region of a second photoresist layer PR2' when the large surface hole V2 of the Comparative Example is formed in the first diagonal direction I1 and an open region of a second photoresist layer PR2 when the large surface hole V2 of the embodiment is formed in an overlapping manner. In the embodiment, when the first island portion IS1 is formed in the first diagonal direction I1, the open region of the second photoresist layer PR2 may be set to be larger than that of the Comparative Example. Accordingly, in the embodiment, the size of the first island portion IS1 in the first diagonal direction I1 may be set smaller than that of the Comparative Example. Accordingly, the embodiment may solve a problem that deposition efficiency is reduced as the elliptical through-holes are disposed in a zigzag form and the island portions are also alternately generated in the zigzag form. That is, the embodiment is to solve a problem that the size of the large surface hole differs in different diagonal directions. To this end, the embodiment may provide a deposition mask having a predetermined size of the island portion regardless of the diagonal direction and having uniform first and second diameters of the large surface holes.

FIG. 13 is a view illustrating cross sections in the first diagonal direction I1 and the second diagonal direction I2 of Comparative Example according to FIGS. 6 and 7.

In the deposition mask of Comparative Example, as the elliptical through-holes is alternately disposed in a zigzag form, there is a problem that the uniformity of the size of the large surface hole and the size of the island portion is deteriorated. Accordingly, there is a problem that a first deposition pattern DP1 formed through a cross section in the first diagonal direction I1 is smaller than a second deposition pattern DP2 formed through a cross section in the second diagonal direction I2. That is, in the deposition mask of the Comparative Example, the size of the through-hole may differ depending on the cross-sectional direction of the diagonal line, and thus there is a problem that the size deviation of the deposition pattern manufactured is large.

FIG. 14 is a view illustrating cross sections in the first diagonal direction I1 and the second diagonal direction I2 of the embodiment according to FIGS. 8 and 9.

In the deposition mask of the embodiment, while the elliptical through-holes are alternately disposed in a zigzag form, the size of the large surface hole and the uniformity of the size of the island portion may be improved by design compensation. Accordingly, the first deposition pattern DP1 formed through the cross section in the first diagonal direction I1 may be uniform with the second deposition pattern DP2 formed through the cross section in the second diagonal direction I2. That is, in the deposition mask of the embodiment, the size of the through-hole may be uniform regardless of the cross-sectional direction, so that the deposition pattern manufactured may have a uniform size, and thus it may be manufactured with excellent quality.

FIGS. 15 and 16 are views illustrating a deposition pattern formed through a deposition mask according to an embodiment.

Referring to FIG. 15, in the deposition mask 100 according to the embodiment, a height H1 between one surface of the deposition mask 100 in which the small surface hole V1 is formed and the communication portion may be about 5 μm or less. Accordingly, a distance between the one surface of the deposition mask 100 and the substrate on which the deposition pattern is disposed may be close, thereby reducing deposition defects caused by a shadow effect. For example, when R, G, and B patterns are formed using the deposition mask 100 according to the embodiment, it is possible to prevent a defect in which different deposition materials are deposited in a region between two adjacent patterns. In detail, as shown in FIG. 16, when the patterns are formed in an order of R, G, and B from left to right, it is possible to prevent the R pattern and the G pattern from being deposited by the shadow effect in a region between the R pattern and the G pattern.

In addition, the deposition mask 100 according to the embodiment may reduce the size of the island portion IS in the effective portion. In detail, since an area of the upper surface of the island portion IS, which is a non-etched surface, may be reduced, the organic material may easily pass through the through-hole TH during deposition of the organic material, thereby improving deposition efficiency.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Therefore, it should be construed that the contents related to such combination and modification are included in the scope of the present invention.

In addition, the above description has been focused on the embodiments, but it is merely illustrative and does not limit the present invention. Those skilled in the art to which the embodiments pertain may appreciate that various modifications and applications not illustrated above are possible without departing from the essential features of the embodiment. For example, each component particularly represented in the embodiments may be modified and realized. In addition, it should be construed that differences related to such a modification and an application are included in the scope of the present invention defined in the appended claims.

The invention claimed is:

1. A deposition mask comprising a metal plate including a deposition region and a non-deposition region, the metal plate extending in a longitudinal-axis direction and in a transverse-axis direction perpendicular to the longitudinal-axis direction, wherein:

the deposition region includes a plurality of effective regions forming a deposition pattern and at least one separation region between a respective pair of the plurality of effective regions, the plurality of effective regions include a plurality of through-holes, and the plurality of through-holes include:

a plurality of small surface holes formed on one surface of the metal plate;

a plurality of large surface holes formed on another surface opposite to the one surface, and having a larger diameter than the small surface holes; and a plurality of communication portions, each of the communication portions communicating one of the small surface holes and one of the large surface holes, wherein each of the communication portions has an elliptical shape having a first diameter and a second diameter that is smaller than the first diameter, the communication portions include first communication portions in which the first diameter are inclined at a first diagonal direction relative to the transverse-axis direction and second communication portions in which the first diameter are inclined at a second diagonal direction relative to the transverse-axis direction, the first and second diagonal directions being different, the large surface holes include first large surface holes connected to, respectively, the first communication portions, and second large surface holes connected to, respectively, the second communication portions, the first large surface holes and the second large surface holes are alternately disposed in a column in the longitudinal-axis direction of the metal plate, the first large surface holes and the second large surface holes are alternately disposed in a row in the transverse-axis direction of the metal plate, a first island portion is disposed between two adjacent first large surface holes in the first diagonal direction and connecting the first diameter of each of two adjacent first communication portions connected to the two adjacent first large surface holes, a second island portion is disposed between two adjacent second large surface holes in the second diagonal direction and connecting the first diameter of each of two adjacent second communication portions connected to the two adjacent second large surface holes, a rib is disposed between the first island portion and the second island portion, and a size deviation between a size of the first island portion and a size of the second island portion that are adjacent to each other is 30% or less, and wherein the size of the first island portion is a maximum width along the first diagonal direction, and the size of the second island portion is a maximum width along the second diagonal direction.

2. The deposition mask of claim 1, wherein the first island portion and the second island portion are adjacent to each other in the transverse-axis direction, the longitudinal-axis direction, or one of the first and second diagonal directions.

3. The deposition mask of claim 1, wherein a size deviation between a size of the first large surface hole and a size of the second large surface hole is 10% or less, and the size of the first large surface hole is a maximum along the first diagonal direction, and the size of the second large surface hole is a maximum along the second diagonal direction.

4. The deposition mask of claim 1, wherein the size deviation between the first island portion and the second island portion is 10% or less.

5. The deposition mask of claim 1, wherein a thickness of the rib is 10 μm to 15 μm, and the thickness of the rib is defined between the one surface of the metal plate and the other surface of the metal plate, and a thickness of the non-deposition region is 15 μm to 25 μm.

6. The deposition mask of claim 1, wherein a ratio of the size of the first island portion to the size of the second island portion (size of the first island portion/size of the second island portion) is 0.65 to 0.9.

7. The deposition mask of claim 1, wherein a communication portion set having two communication portions of two adjacent first large surface holes in the longitudinal-axis direction and two communication portions of two adjacent second large surface holes in the transverse-axis direction has a pinwheel shape.

8. The deposition mask of claim 7, wherein the communication portion set includes a first through-hole set and a second through-hole set, and the first through-hole set and the second through-hole set are disposed in a row in the transverse-axis and the longitudinal-axis.

9. The deposition mask of claim 8, wherein the first island portion is disposed between the first through-hole set and the second through-hole set, and the second island portion is disposed at a center in the first through-hole set and at a center in the second through-hole set.

10. The deposition mask of claim 8, wherein the first diameter is greater than the second diameter, a ratio of the second diameter to the first diameter (second diameter/first diameter) is 0.7 to 0.93.

11. The deposition mask of claim 1, wherein the first diameter is greater than the second diameter, the first diameter is 50 μm or less, and a difference between the first diameter and the second diameter is 10 μm or less.

12. The deposition mask of claim 1, wherein a shape of the large surface holes differs from the elliptical shape of the communication portions.

13. The deposition mask of claim 12, wherein the large surface holes are formed in a circular shape.

14. The deposition mask of claim 1, wherein the first island portion and the second island portion are defined as regions in which the metal plate is not etched.

15. The deposition mask of claim 1, wherein an extension direction of one of the communication portion between corresponding ones of the small surface holes and large surface holes is inclined at an angle of 1° to 60° or −1° to −60° with respect to at least one of the longitudinal-axis direction or the transverse-axis direction of the metal plate.

16. The deposition mask of claim 1, wherein one of the large surface holes includes a first inner surface and a second inner surface, the first inner surface includes a first sub first inner surface adjacent to one end of the first diameter and a second sub first inner surface adjacent to another end of the first diameter, an inclination angle of a cross-section of the first sub first inner surface and an inclination angle of a cross-section of the second sub first inner surface correspond to each other, the second inner surface includes a first sub second inner surface adjacent to one end of the second diameter and a second sub second inner surface adjacent to another end of the second diameter, and an inclination angle of a cross-section of the first sub second inner surface and an inclination angle of a cross-section of the second sub second inner surface correspond to each other.

17. The deposition mask of claim 16, wherein ribs are disposed in a region where the first inner surfaces adjacent to each other are connected to each other and a region where the second inner surfaces adjacent to each other are connected to each other.

18. The deposition mask of claim 1, wherein widths of the first island portion and the second island portion is 2 μm or more.

* * * * *